United States Patent [19]

Hochreuther et al.

[11] 4,439,726

[45] Mar. 27, 1984

[54] PORTABLE MULTIMETER HAVING TWO SUBASSEMBLIES WITH A HINGE FOR FOLDING

[75] Inventors: Karl Hochreuther; Siegfried Heinze, both of Nuremberg, Fed. Rep. of Germany; Werner Scholpp, Gries, Austria

[73] Assignee: Brown, Boveri & Cie AG, Mannheim, Fed. Rep. of Germany

[21] Appl. No.: 184,253

[22] PCT Filed: Aug. 16, 1979

[86] PCT No.: PCT/DE79/00086

§ 371 Date: Apr. 22, 1980

§ 102(e) Date: Apr. 22, 1980

[87] PCT Pub. No.: WO80/00495

PCT Pub. Date: Mar. 20, 1980

[30] Foreign Application Priority Data

Aug. 22, 1978 [DE] Fed. Rep. of Germany ....... 2836679

[51] Int. Cl.³ .................... G01R 1/04; G01R 15/12
[52] U.S. Cl. .................... 324/156; 324/73 R; 324/115; 73/431
[58] Field of Search .................. 324/156, 115, 73 R; 73/431; D10/46, 75

[56] References Cited

U.S. PATENT DOCUMENTS

D. 241,726 10/1976 D'Antonio ............... D10/46
3,829,773 8/1974 Nigg ....................... 73/431

OTHER PUBLICATIONS

"Compact, 'Diary', Checkbook, All Count" 5/1975, Electronics, vol. 48, No. 7, pp. 40-41.

Primary Examiner—Gerard R. Strecker
Assistant Examiner—Walter E. Snow
Attorney, Agent, or Firm—Herbert L. Lerner; Laurence A. Greenberg

[57] ABSTRACT

Portable multimeter, including an indicating subassembly for visualizing a measured value of a measuring variable to be examined, a processing subassembly for converting or adapting the measuring variable, separate housings for the subassemblies being connected to each other and having edges about which the housings are swingable for folding together into a rest position, control and indicating parts to be protected being disposed toward the inside of the housings in the rest position, a bead disposed in the vicinity of the edges forming a hinge and increasing the useful interior space of the housings, the hinge including at least one interacting hinge element being integral with each housing and rotatably connecting the housings together.

20 Claims, 8 Drawing Figures

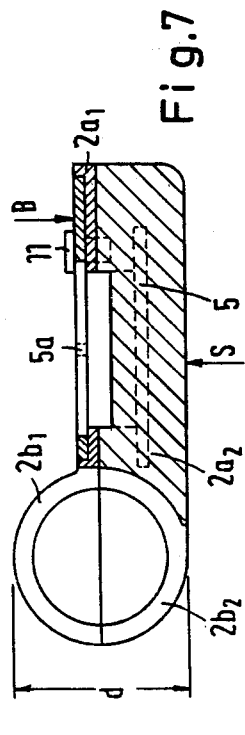
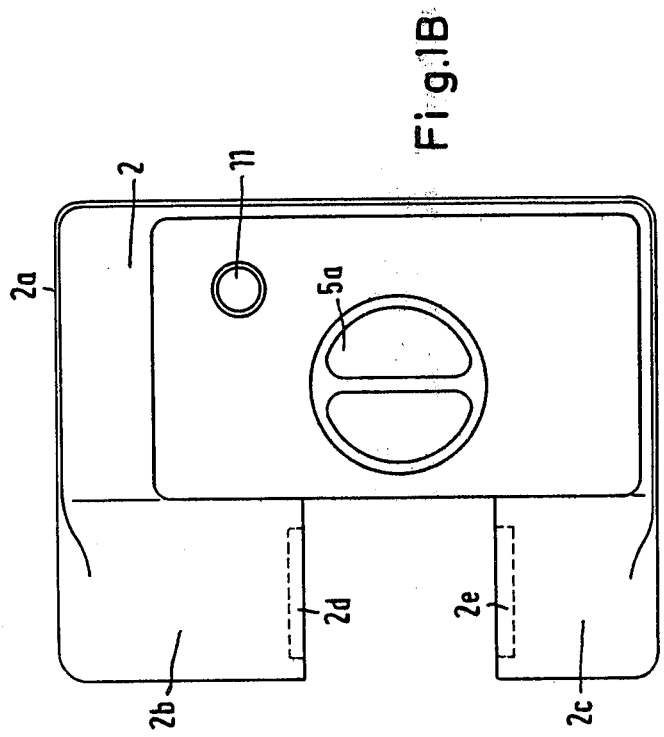
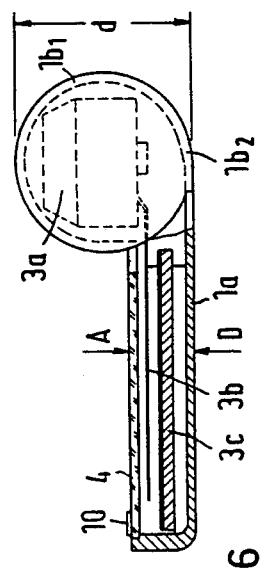
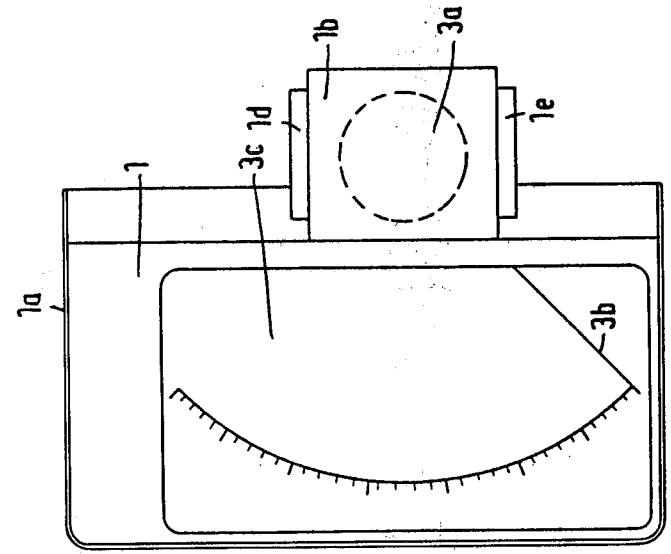

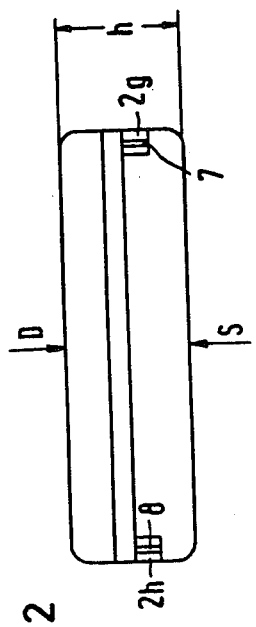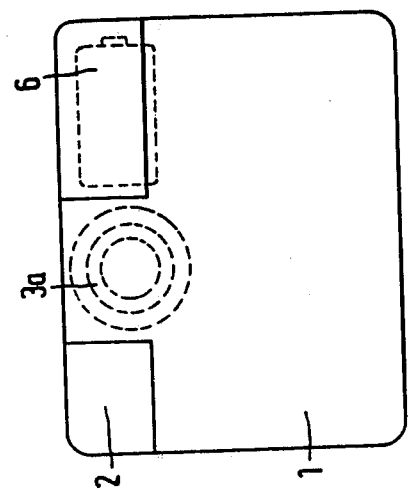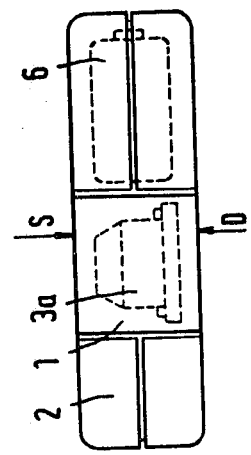
Fig.2  Fig.4  Fig.5
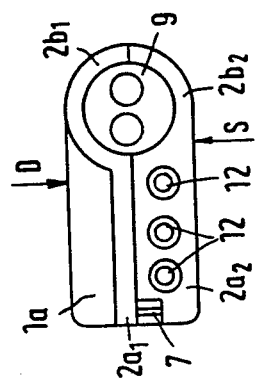
Fig.3

PORTABLE MULTIMETER HAVING TWO SUBASSEMBLIES WITH A HINGE FOR FOLDING

The invention relates to a portable multimeter having an indicating subassembly for visualizing the measured value of a measuring variable to be examined, a processing subassembly for converting or adapting the measuring variable, separate housings for the subassemblies being connected to each other in such a way that they can be folded together in a rest condition, and control and indicating parts to be protected which come to lie toward the inside.

If one disregards the electrical properties of a multimeter, good readability, convenient handling and ruggedness of special importance to the user.

Good readability requires a large indicating area for displaying the measured value. At the same time the indicating area should be arranged so that the viewer can occupy a nearly perpendicular direction of view thereto without contortions.

Convenient handling necessitates, for one thing that the measuring instrument is light and handy and that it can be taken along without difficulty to various work stations. Furthermore, the individual control elements must be highly accessible.

Ruggedness is required in a multimeter if only for the reason that it must be transported frequently. Sensitive parts such as those made of glass must not break and the indicating and control elements must not get dirty.

It is self-evident that not all of the mentioned requirements can be fulfilled without difficulty since they necessitate in part divergent measures. Thus, a large indicating area can be realized in a small handy measuring instrument only with difficulties. Also the requirement for ruggedness to mechanical stress during transport can be met only by measures which lead to a larger measuring instrument. This applies to the use of protective cases which, in addition, are almost always in the way, as well as to the use of a cover which can be hinged over the elements to be protected.

It appears at first obvious to construct a multimeter, similar to that described in German Published Nonprosecuted Patent Application 2 636 079 in such a manner that parts of the measuring instrument are accommodated in a cover-like flap which can be swung out. From German Published Nonprosecuted Patent Application 2 458 766 it is furthermore known to subdivide a measuring instrument in such a manner that an indicating subassembly with the measuring mechanism and scale as well as a processing subassembly with measuring range selector and amplifier are created.

A foldable multimeter, in which the indicating subassembly is mounted in the cover would have considerable advantages over equipment of conventional design. For transport, such an instrument could simply be folded so that the then inner control and indicating elements would be protected by the outer housing parts. It would be an additional advantage that when the instrument is folded out, the control and indicating areas together would be twice as large as its base area. The originally contradictory requirements for a large indicating area and ruggedness on the one hand, and easy handling on the other hand, can therefore largely be met in this manner.

Although the idea to design a foldable multimeter may be self-suggesting, the practical construction of a really handy and practical instrument presents considerable problems, the solution of which is an object of the invention. In particular, it is an object of the invention to provide a portable multiple measuring instrument which is of flat design with rounded external corners so that the folded instrument can be put in a trouser pocket if necessary. The housing of the measuring instrument must be designed so that with small external dimensions, the interior is well utilized and at the same time, favorable conditions for reading and operating the measuring instruments are obtained.

This problem is solved in a portable multimeter comprising an indicating subassembly for visualizing a measured value of a measuring variable to be examined, a processing subassembly for converting or adapting the measuring variable, separate housings for the subassemblies being connected to each other and having edges about which the housings are swingable for folding together into a rest position, control and indicating parts to be protected being disposed toward the inside of the housings in the rest position, a bead disposed in the vicinity of the edges forming a hinge and increasing the useful interior space of the housings, the hinge including at least one interacting hinge element being integral with each housing and rotatably connecting the housings together. Advantageous embodiments and further developments of the invention are characterized in the subclaims.

The advantages achieved with the invention are in particular that through design of a cylindrical bead with relatively large diameter as a hinge it becomes possible to hinge the two housings relative to each other and that on the other hand relatively much room for components of the measuring instrument remains in the interior of the cylindrical bead. The large hinge elements make it easy to provide between their contact services friction of such kind that the indicating subassembly can be brought into almost any desired angular position relative to the processing subassembly without the possibility that gravity would cause tilting from this position. The rounding of the cylindrical bead is otherwise in line with the requirement for rounded corners.

An embodiment example of the invention is shown in the drawing and will be described in greater detail in the following.

FIGS. 1a and 1b are diagrammatic top plan views of the multimeter unfolded with an opening angle of 180°, i.e. with a view onto the indicating and operating plane. (To make the details of the hinge elements more visible the two subassemblies are separately shown. FIG. 1a shows the indicating subassembly and FIG. 1b the processing subassembly);

FIG. 2 is a front elevational view of the folded multimeter standing on its base;

FIG. 3 is a side elevational view of the folded multimeter, with a view onto the input jacks;

FIG. 4 is a top plan view of the folded multimeter;

FIG. 5 is a rear elevational view of the folded multimeter;

FIG. 6 is a cross-sectional view of an indicating subassembly with the measuring mechanism, taken along the center line of the measuring mechanism; and FIG. 7 is a cross-sectional view of a processing subassembly, the section lying in the same plane as in the case of the indicating subassembly.

As shown in FIG. 1 the multimeter consists of an indicating subassembly 1 and a processing subassembly 2. In the housing 1a of the indicating subassembly 1 accommodated in particular are such components which serve to make the measured value of a measurement quantity visible. In the present example, the measured value is indicated by means of an electromechanical measuring mechanism 3, the measuring mechanism tube 3a, pointer 3b and scale dial 3c are shown in FIG. 1a. The housing 1a is designed, however, in such a manner that the measuring mechanism 3 can be replaced as well by a digital display, for instance, of light-emitting diodes or liquid crystals. The indicating elements are protected by a clear panel 4.

Since the measuring variable, particularly in a multimeter, is rarely available with a value which can be fed directly to the indicating subassembly 1, a suitable conversion or adaption must be performed first. The components required therefor such as range switches, amplifiers etc. are combined in the processing subassembly 2 shown in FIG. 1b.

If there is room, components which basically would belong to the processing subassembly 2 could also be accommodated in the indicating subassembly 1 or vise versa. The law of practicability applies to the partitioning; however, the object of the invention, namely, to increase the indicating area by arranging the operating elements on an additional area must be achieved.

The indicating subassembly 1 shown in FIG. 1b in a view toward the indicating plane, is shown in FIG. 6 as seen from the side in a cross section, the cross section having been taken along the center line of the measuring mechanism 3. FIGS. 1b and 7 have the same mutual relationship. It is seen from the illustrations that the housings 1a, 2a of the two subassemblies 1, 2 have a basically prismatic shape except for the rounded outer corners.

This basic shape however, is abandoned in the vicinity of the edge around which the rotation between the two housings 1a, 2a is to take place. In the vicinity of this edge, a cylindrical bead 1b, 2b, 2c is formed in both housings which increases the usable interior space of the two housings substantially and in addition, acts as a hinge.

Although the cylindrical bead 1b, 2b, 2c is a firmly integrated part of the housings 1a, it has been provided with separate reference numerals for designating it more clearly. Otherwise, this bead is made so that it is practically not visible when the two housings are folded together (FIGS. 3 to 5). This means that its outside diameter corresponds to the total height of the two folded-together housings and its outside surface is merged gradually into the outer mounting surface S as well as the top surface D without rising above them. On the other hand, the cylindrical bead extends substantially beyond the inner operating surface B and the indicating surface A.

In the present example, the cylindrical bead is subdivided into three hinge elements 1b, 2b, 2c. The hinge element 1b, which belongs to the housing 1a of the indicating subassembly 1, is positioned between two hinge elements 1b, 2c which belong to the housing 2a of the processing subassembly 2. The tripartition of the cylindrical bead chosen here, however, is not necessary, since a subdivision into more than three hinge elements is also possible; it is also possible to chose only two hinge elements. In that case parts of the cylinder surfaces would have to be nested with an overlap on one side and be anchored to each other.

The solution shown in the drawing provides support on two sides for the central hinge element 1b which belongs to the indicating subassembly 1. For this purpose, the cylindrical body of the hinge element 1b is recessed on both sides so far that two bearing rings 1d, 1e are produced. The bearing rings fit into corresponding recesses 2d, 2e of the hinge elements 2b, 2c. The hinge elements are designed so that the two housings 1a, 2a permit a rotation relative to each other of 0° to 180°. So that the housings can be brought into a position optimum for the viewer within this range of rotation and so that they retain this position against the force of gravity, suitable friction between the bearing surfaces is provided. The friction can be provided either by an appropriate fit or by detents made between the bearing surfaces.

The assembly of the hinge elements 1b, 2b, 2c and thereby, of the housings 1a, 2a is made possible by the special design of the housing 2b. The latter consists of two housing shells $2a_1$, $2b$, $2a_2$, $2b_2$, the parting plane of which is parallel to the operating surface D and bisects the cylindrical bead 2b. If the upper housing shell $2a_1$, $2b_1$ is removed, the hinge element 1b of the indicating subassembly 1 can be inserted. The parts required for connecting the upper housing shell $2a_1$, $2b_1$ to the lower housing shell $2a_2$, $2b_2$ are not shown herein, since they are designed as screw or clamping elements in a manner known per se.

The operating elements such as for instance the knob 5a for operating the range selection switch 5 are let into the upper housing shell $2a_1$, $2b_1$ in such a manner that they do not protrude beyond the operating plane B. When the two subassemblies are folded together, the indicating surface A and the operating surface D therefore lie flat on top of each other. However, on one of the two surfaces a buffer element 10 can be arranged which prevents the two subassemblies from hitting each other hard.

Of substantial importance is the fact that the interior of the hinge elements can be utilized well. Its cylindrical shape is particularly well suited for receiving a battery 6, for instance of the commercially available monocell type. The battery 6 can readily be replaced through a removable cover 9 which closes off the respective hinge element at its outer end face. The hinge elements 2d, 2e are otherwise made different lengths so as to adapt their interior to the prevailing requirements optimally. The central hinge element belonging to the indicating subassembly 1 is accordingly offset relative to the center of the housing.

Design ideas of a special kind were required in conjunction with the assembly of the electromechanical measuring mechanism 3. The objective to build a measuring instrument as flat as possible can be realized only if the tube 3a of the measuring mechanism does not determine the total height of the indicating subassembly 1. A solution to the problem of accommodating the measuring mechanism tube 3a in the hinge element 1b of the indicating subassembly 1 was initially prevented by the fact that the interior of the hinge element is located substantially above the indicating surface A and therefore also the scale dial 3c, while the measuring mechanism tube 3a is arranged in a customary measuring mechanism substantially below the scale dial in the vicinity of its rear side.

As can be seen from FIG. 6, the measuring mechanism 3 inserted into the indicating subassembly 1 is constructed so that additional control and indicating parts in the form of the measuring mechanism tube 3a extend into the hinge element 1b. The height of the housing 1a is therefore determined in substance by the scale dial 3c and the measuring pointer 3b. The hinge element 1b consists of two housing parts 1b₁, 1b₂, which are separated for inserting the measuring mechanism. The connecting elements required for assembling the housing parts are not shown in detail either, since known techniques are used.

It is of particular advantage to the user that the indicating subassembly 1 can be brought into any desired angular position relative to the processing subassembly 2. This not only makes it possible to bring the instrument into an optimum position on any work table but also to hang it around the neck on a carrying belt during the measurement. The carrying belt can be fastened to two pins 7, 8 which are inserted at the corners in the vicinity of the front side opposite the cylindrical bead of the processing subassembly 2 in recesses 2g, 2h. The measuring instrument hung around the neck rests with its standing surface S against the body and makes readings convenient if the indicating part 1 is angled off about 90°. The technician's hands are therefore free for his work.

The operation of the measuring instrument is further facilitated by the fact that in the area of the operating plane B a pushbutton 11 is arranged which automatically disconnects the measuring equipment (for instance, the amplifier part) when the subassemblies are folded together. The switch can be designed so that it can also be brought into the off position by rotating or sliding if the instrument is open. It would likewise be possible to couple the switch to the hinge elements in such a way that it switches off if the angle of the position falls below a certain value.

The input jacks 12 for connecting the measuring lines are accommodated in the processing assembly and are accessible from the side (FIG. 3). The measuring lines therefore need not be removed when the instrument is folded up. However, the input jacks 12 could also be accommodated in the vicinity of the operating plane (B). In that case, however, it would be advantageous if the indicating subassembly covered up the operating plane only so far that the jacks also remain accessible in the folded-up condition.

We claim:

1. Portable multimeter, comprising an indicating subassembly for visualizing a measured value of a measuring variable to be examined, a processing subassembly for adapting the measuring variable to a quantity able to be visualized by said indicating subassembly, separate housings for said subassemblies being connected to each other and having edges facing away from the insides of said housings, said edges being swingable together for folding said housings together into a rest position, control and indicating parts to be protected being disposed at least partially inside of said housings in the rest position, terminals disposed on one of said housings for receiving data to be indicated, said housings containing a bead disposed in the vicinity of said edges being swingable together, said bead forming a hinge being hollow defining an interior space adequate for receiving additional control and indicating parts, said hinge including at least one interacting hinge element being integral with each housing and rotatably connecting said housings together.

2. Portable multimeter according to claim 1, wherein said bead is cylindrical.

3. Portable multimeter according to claim 1, wherein said housings are substantially prismatic except for said bead and have outer surfaces, said bead having ends being co-planar with said outer surfaces.

4. Portable multimeter according to claim 4, wherein said housings have a given total height when folded together and have inner, operating and indicating surfaces, said bead being extended beyond the plane of at least one of said inner, operating and indicating surfaces and said bead having an outside diameter substantially corresponding to said given total height of said folded-together housings.

5. Portable multimeter according to claim 2, wherein said hinge has three hinge elements, one of said hinge elements being a central hinge element integral with said housing of said indicating subassembly and having offset bearing rings integral therewith, the other two of said hinge elements being outer hinge elements integral with said housing of said processing subassembly and overlapping said bearing rings.

6. Portable multimeter according to claim 2, wherein said housings have an operating surface, said bead has a given outside diameter and protrudes above said operating surface by less than half of the outside diameter, and said housing of said processing subassembly has two housing shells defining parting surfaces therebetween being parallel to said operating surface and bisecting parts of said bead at said processing subassembly housing.

7. Portable multimeter according to claim 1 wherein said indicating subassembly housing has an indicating surface, and said processing subassembly housing has an operating surface, and including a buffer element disposed on one of said surfaces, said indicating surface resting flat on said operating surface with said buffer element being disposed therebetween in folded condition and an operating element being disposed in a depression formed in said operating surface.

8. Portable multimeter according to claim 7, wherein said operating element is a knob.

9. Portable multimeter according to claim 7, wherein said operating element is a measuring range selector.

10. Portable multimeter according to claim 1, wherein said interacting hinge elements are rotatable up to 180° and include means for retaining said housings in any angular position against the force of gravity.

11. Portable multimeter according to claim 10, wherein said retaining means are detents.

12. Portable multimeter according to claim 10, wherein said retaining means are frictional connections between said hinge elements.

13. Portable multimeter according to claim 5, wherein said central hinge element is offset relative to the center of said housings and said outer hinge elements have unequal lengths.

14. Portable multimeter according to claim 5 or 13, wherein at least one of said outer hinge elements has an interior equipped for receiving commercially available batteries, and a removable cover for closing off said interior from the surroundings.

15. Portable multimeter according to claim 5, including an electromechanical measuring mechanism with electromagnetic parts, a scale having a front disposed in a given plane and an indicator, said scale and indicator being disposed in said indicator subassembly housing, said central hinge element having an interior, containing said electromagnetic parts, most of said electromagnetic parts being extended beyond the plane of said front of said scale.

16. Portable multimeter according to claim 2, wherein said housings have sides and corners opposite said bead, and including pins for fastening a carrying belt being inserted in recesses formed in said corners of said processing subassembly housing.

17. Portable multimeter according to claim 1, wherein said housings include an operating plane and a pushbutton engageable for disconnecting the portable multimeter from a current source, said pushbutton being disposed on said operating plane, said pushbutton being engaged by said indicating subassembly when said housings are folded together, and said pushbutton being movable into a rest position for switching off if said housings are opened.

18. Portable multimeter according to claim 1, wherein said housings include an operating surface, said indicating subassembly covering part of said operating surface, and including individual operating elements disposed on said operating surface and remaining accessible when said housings are folded shut.

19. Portable multimeter according to claim 18, wherein said operating elements are in the form of input jacks.

20. Portable multimeter according to claim 1, wherein said hinge elements are co-axial and rotate within each other.

* * * * *